(12) United States Patent
Tsai et al.

(10) Patent No.: US 7,800,298 B2
(45) Date of Patent: Sep. 21, 2010

(54) LIGHT-EMITTING DEVICE HAVING A PLANARIZED COLOR FILTER

(75) Inventors: Yaw-Ming Tsai, Taichung Hsien (TW);
Hsiu-Chun Hsieh, Changhua (TW);
Shih-Chang Chang, Hsinchu (TW)

(73) Assignee: TPO Displays Corp., Chu-Nan (TW)

( * ) Notice: Subject to any disclaimer, the term of this patent is extended or adjusted under 35 U.S.C. 154(b) by 490 days.

(21) Appl. No.: 12/008,530

(22) Filed: Jan. 11, 2008

(65) Prior Publication Data

US 2008/0129196 A1  Jun. 5, 2008

Related U.S. Application Data

(62) Division of application No. 10/995,594, filed on Nov. 22, 2004, now Pat. No. 7,338,338.

(30) Foreign Application Priority Data

May 12, 2004  (TW) .............................. 93113288 A

(51) Int. Cl.
*H01J 1/62* (2006.01)
(52) U.S. Cl. ....................................... 313/504; 313/500
(58) Field of Classification Search .......... 313/498–512
See application file for complete search history.

(56) References Cited

U.S. PATENT DOCUMENTS 7,183,146 B2   2/2007  Yamazaki et al.
2003/0082859 A1  5/2003  Ichijo et al.

FOREIGN PATENT DOCUMENTS

CN  1438827  8/2003
JP  2001-174617  6/2001

*Primary Examiner*—Joseph L Williams
(74) *Attorney, Agent, or Firm*—Liu & Liu

(57) ABSTRACT

A light-emitting device and the fabrication method thereof. A substrate is provided. A plurality of active elements are formed on the substrate, defining a plurality of pixel areas. A color filter is formed on the pixel areas. The surface of the color filter is planarized to reduce roughness. An electrode is formed on the color filter. An light-emitting layer is formed on the electrode. A second electrode is formed on the light-emitting layer.

20 Claims, 8 Drawing Sheets

US 7,800,298 B2

LIGHT-EMITTING DEVICE HAVING A PLANARIZED COLOR FILTER

This is a Divisional of U.S. patent application Ser. No. 10/995,594, filed Nov. 22, 2004, which is commonly assigned to the assignee of the present invention, and which is incorporated by reference herein as if fully set forth herein.

BACKGROUND OF THE INVENTION

1. Field of the Invention

The present invention relates to a light-emitting device, and more particularly to a light-emitting device with a color-filter-on-array structure.

2. Description of the Related Art

With recent interests and development, organic light-emitting diode (OLED) devices have become a potential candidate to replace Liquid Crystal Displays (LCDs) for next-generation display. With their active light-emitting characteristics, OLED devices, unlike LCDs, do not require a backlight module to provide a light source, benefiting their weight reduction. In addition, OLED devices provide high resolution and quick response, and a wider viewing angle (to 160°) than LCDs.

OLED devices utilize an organic light-emitting diode to provide the light source. The organic light-emitting diode uses an organic layer as an active layer, sandwiched between an anode and cathode electrodes to form a stacked layer. At least one of the electrodes is transparent to allow light transmission.

FIG. 1 is a cross-section view of a conventional OLED device. The OLED device 1 includes a substrate 2, monochromatic light-emitting diodes 3, and thin film transistors 20. Monochromatic light emitted from a active layer 30 of the light-emitting diodes 3 converts to red, green or blue light respectively after passing through a red 81, green 82, or blue 83 color-filtering unit. The substrate 2 is a transparent substrate of, for example, glass or polymer. As a polymeric substrate, the substrate 200 can be made of polyethyleneterephthalates, polyesters, polycarbonates, polyacrylates or polystyrenes. Furthermore, the color-filtering unit is formed by, for example, pigment dispersion, dyeing, electrodeposition, or printing In FIG. 1, an indium-tin-oxide (ITO) layer is formed over the substrate 2 to serve as a transparent anode 31, with a counter cathode electrode 32 of a low-work-function metal or alloy, such as Ca, Al, MgAg or AlLi.

In the conventional OLED device, the color-filtering units 81, 82 and 83 generally have severe surface roughness Ra around 20 nm. If the transparent anode electrode 31 is directly formed on the color-filtering units 81, 82 and 83, the surface roughness of the transparent anode electrode 31 is definitely affected, thereby resulting in a surface roughness also around 20 nm. In addition to failure to fulfill the requirements of an OLED device (preferred surface roughness of the electrode less than 10 nm), short circuit and current-leakage may also be caused, deteriorating performance.

To avoid the above shortcomings, a additional planarization layer 5 must be placed between the transparent electrode 31 and the color-filtering units 81, 82 and 83, to avoid the inherent surface roughness of color-filtering units 81, 82 and 83 affecting subsequent electrode formation. However, the process complexity is increased, resulting in high manufacturing costs and time-consuming.

Therefore, it is necessary to develop a simple and efficient manufacturing method for an OLED with a color-filter-on-array structure to obtain OLEDs having smoother transparent electrode surfaces.

SUMMARY OF THE INVENTION

Accordingly, the present invention is to reduce the surface roughness of the color filter by direct planarization of the color filter without providing a separate planarization layer on the color filter to support planar-electrode formation. This simplifies light emitting device fabrication and improves performance.

In one aspect of the present invention, the color filter is planarized, after being formed on the active matrix substrate to complete a COA structure, to reduce surface roughness and ensure a planar surface of the consequential electrode.

In one embodiment, the method of fabricating a light-emitting device, comprises the steps of providing a substrate, forming a plurality of active elements on the substrate, forming a color filter on the substrate, planarizing the surface of the color filter to reduce roughness, and forming a first electrode on the color filter. The invention may further comprise the steps of forming an light-emitting layer on the first electrode, forming a second electrode on the light-emitting layer, and disposing a second substrate on the second electrode, facing the substrate.

The invention further provides a light-emitting device, comprising a color filter on an active matrix substrate, with a surface roughness (Ra) of less than 10 nm, a first electrode on the color filter, with a surface roughness (Ra) of less than 10 nm, a light-emitting layer on the electrode, a second electrode on the light-emitting layer, and a substrate on the second electrode, facing the active matrix substrate.

In one embodiment, the surface roughness (Ra) of the color filter is planarized to less than 10 nm, and the first electrode is formed having a surface roughness (Ra) less than 10 nm.

The surface of the color filter can be planarized by, for example, UV treatment, $O_2$ plasma treatment or polishing, wherein UV treatment can be, for example, an excimer UV treatment or a corona treatment. The polishing can be, for example, chemical mechanical polishing. Both the color filter and the first electrode are preferably polished. The color filter can be, for example, planarized by plasma that exposure to Ar, $O_2$ or $H_2O$ before formation of the ITO electrode to reduce surface roughness (Ra) to less than 10 nm.

The first electrode can be, for example, indium tin oxide (ITO), and the second electrode can be, for example, Ca, Al, Mg, MgAg, AlLi or combinations thereof. In one embodiment, the method includes planarizing the surface of the first electrode.

The first electrode, light-emitting layer and second electrode may form a monochromatic light-emitting device. The monochromatic light-emitting device can be, for example, a white-light light-emitting device.

The light-emitting layer can be, for example, a stacked layer of an electron-injecting layer, an electron-transport layer, a light-emitting layer, a hole-transport layer, and a hole-injecting layer. The active elements may comprise an amorphous-Si thin-film transistor or a poly-Si thin-film transistor.

In one embodiment, the present invention is also directed to an organic light-emitting device, which may comprise a color filter on an active matrix substrate, with a surface roughness (Ra) of less than 10 nm, an electrode on the color filter, with a surface roughness (Ra) of less than 10 nm, an organic light-emitting layer on the electrode, a second electrode on the organic light-emitting layer, and a substrate on the second electrode, facing the active matrix substrate.

DESCRIPTION OF THE DRAWINGS

The present invention can be more fully understood by reading the subsequent detailed description and examples with references made to the accompanying drawings, wherein.

DETAILED DESCRIPTION OF THE INVENTION

The present invention is described in connection with the embodiments of organic light-emitting devices. However, it is within the scope and spirit of the present invention to apply to other types of light-emitting devices, such as polymer light-emitting devices, chemiluminescent devices, backlit LCD, etc.

Figure 1:
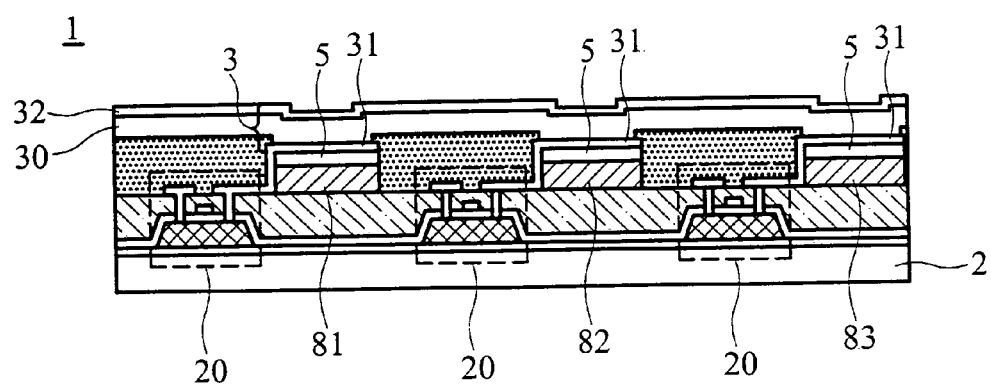
FIG. 1 is a cross-section view of a conventional OLED device.
Figure 2:
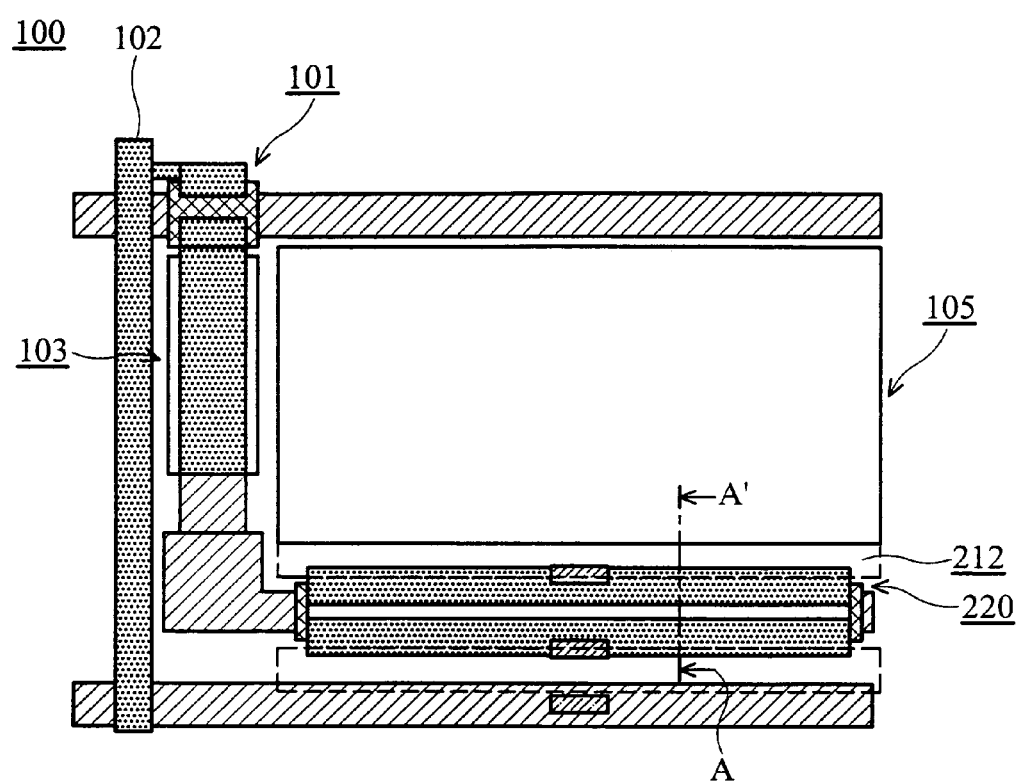
FIG. 2 is a schematic top view illustrating an organic light emitting device according to the present invention.
Figure 3:
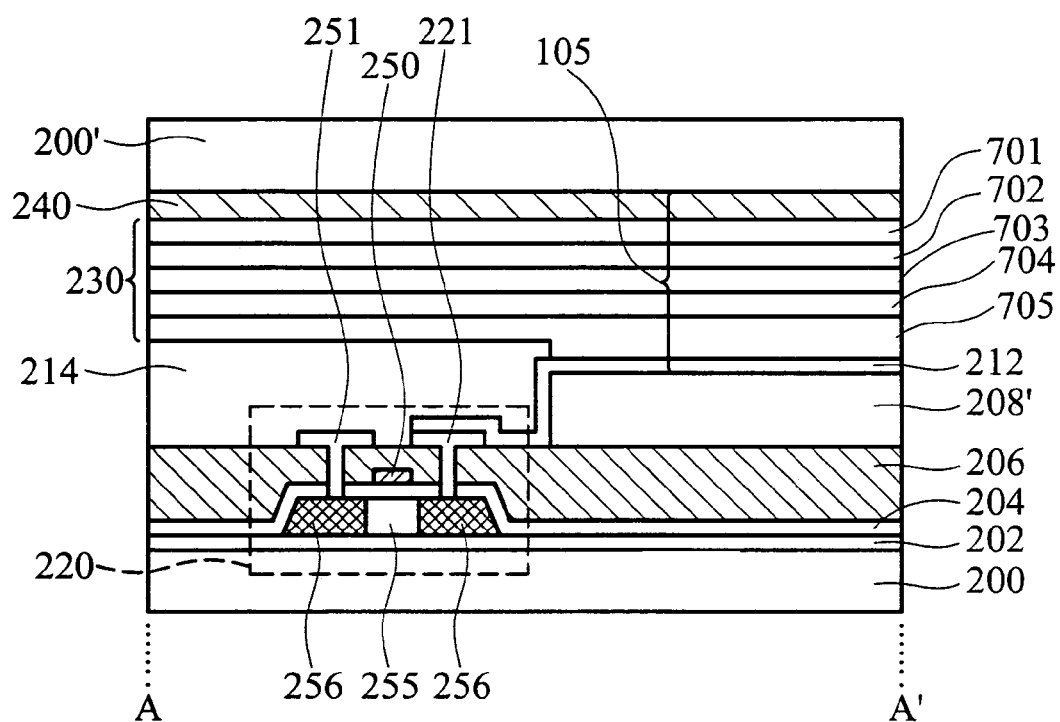
FIG. 3 is a sectional diagrams along line A-A' of FIG. 2.

FIG. 2 is a schematic top view of an organic light-emitting device according to the present invention. The organic light-emitting device 100 comprises a plurality of pixel areas arranged in a matrix form. Each pixel area comprises a TFT 101 electrically connected to a data line 102, a capacitor 103, an organic light-emitting diode 105, and another TFT 220 electrically connecting to the organic light-emitting diode 105. FIG. 3 is a sectional diagrams along line A-A' of FIG. 2, and FIGS. 4A to 4E are sectional diagrams along line A-A' of FIG. 2 illustrating the manufacturing process of the organic light-emitting device according to a embodiment of the present invention.

Figure 4A:
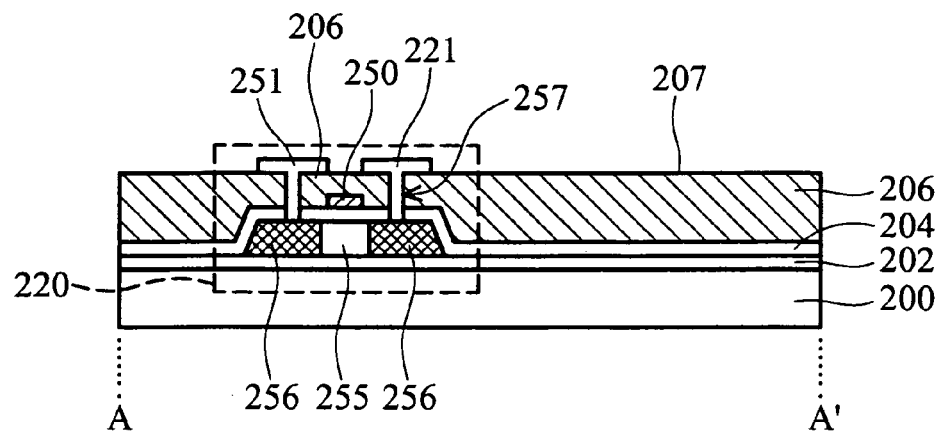
FIGS. 4A to 4E are sectional diagrams along line A-A' of FIG. 2 illustrating the manufacturing process of the organic light emitting device according to the present invention.
Figure 4B:
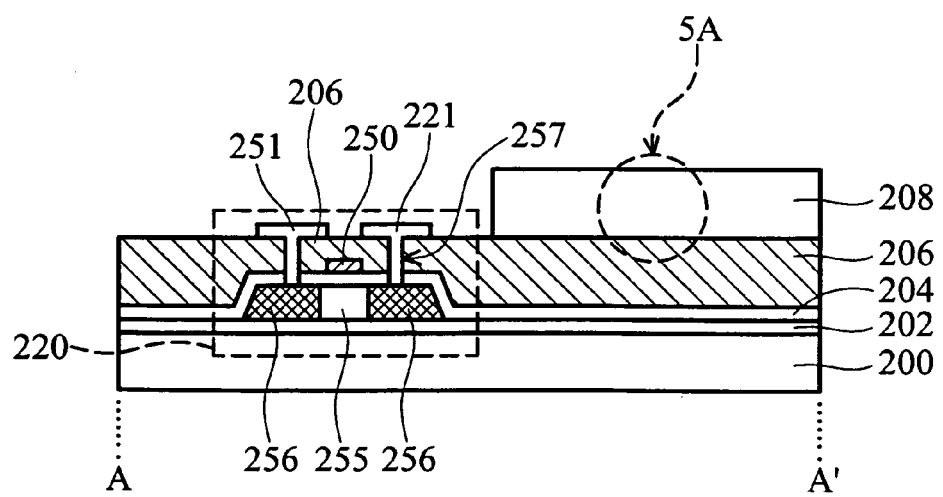

FIGS. 4A-4B illustrate the fabrication of an active matrix substrate 300 with a color-filter unit 208. The active matrix substrate 300 of the invention may be a transparent substrate 200 of, for example, glass substrate, with an a-Si-TFTs array or an LTPS (low temperature poly silicon) TFTs array.

In the embodiment, an active matrix substrate of an LTPS array, with top-gate TFTs, is used to explain the inventive organic light-emitting device and the fabrication method thereof. However, an active matrix substrate with bottom-gate TFTs is applicable as well.

In FIG. 4A, a substrate 200 is provided with a buffer layer 202 formed thereon. A plurality of top-gate LTPS-TFTs 220 are formed on the buffer layer 202, wherein the top-gate LTPS-TFT 220 includes a gate electrode 250, a source electrode 251, a drain electrode 221, a gate insulating layer 204, a channel region 255, and a source/drain region 256. The drain electrode 221 couples to the source/drain region 256 via a contact hole 257 of a dielectric layer 206. The dielectric layer 206 has a predetermined area 207 defined for color-filter formation, on which an organic light-emitting unit will be formed thereon subsequently.

The LTPS-TFTs 220 serve as controlling units of the organic light-emitting device.

In FIG. 4B, a color filter 208 is formed on the predetermined area 207. The color filter 208 may be a red, green, or blue color-filtering unit, or a combination thereof to achieve a full-color display.

Figure 5A:
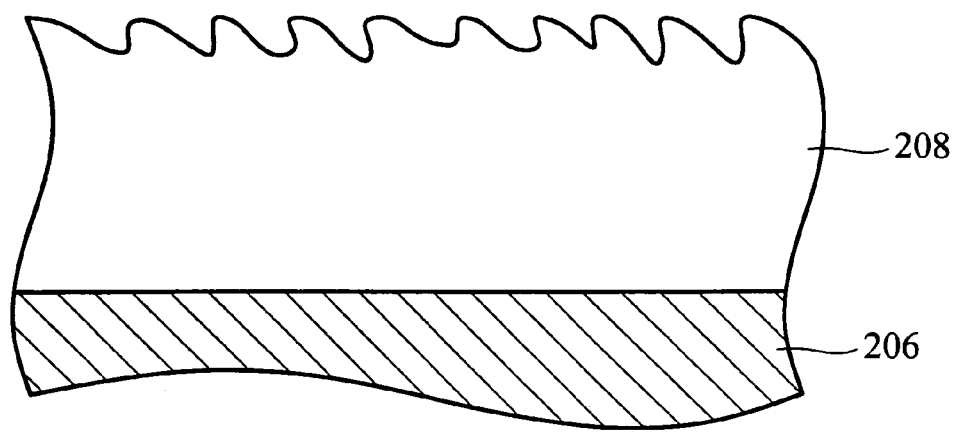
FIG. 5A is a close-up cross-section view of location 5A shown in FIG. 4B.

FIG. 5A is a close-up cross-section view of location 5A shown in FIG. 4B. Owing to the severe surface roughness of the color filter 208, the direct deposition of a following electrode may result in a rough final surface. Therefore, a feature step of the invention is performed herein, to planarize the surface of the color filter 208.

The color filter 208 can be planarized by, for example, UV treatment, $O_2$ plasma treatment or polishing. The TV treatment can be, for example, an excimer UV treatment or a corona treatment. The excimer UV treatment can be performed, for example, with a UV light of 200-400 nm for 10-120 seconds. The corona treatment can be performed, for example, by a conventional or 3-D corona treatment system. The polishing treatment can be, for example, chemical mechanical polishing. In addition to polishing the color filter 208, the electrode formed thereon may be polished to ensure a planar surface.

In addition, the O2 plasma treatment can be exposure to Ar, O2 or H2O during the formation of the electrode to reduce surface roughness (Ra) of the color filter to less than 10 nm.

In the embodiment, an excimer UV light with a wavelength of 308 nm is applied to planarize the color filter 208. FIG. 5B is a close-up cross-section view of location 5B shown in FIG. 4C after planarization. The surface roughness Ra of the color filter 208' after planarization for various periods is listed in Table 1. According to Table 1, the surface roughness Ra of the color filter 208' is effectively reduced to less than 10 nm, ensuring that final surface roughness of the electrode is less than 10 nm as well, fulfilling the requirements of an OLED device.

TABLE 1

Results of Excimer UV Treatment

| No. | Treating time (sec) | surface roughness Ra (nm) |
| --- | --- | --- |
| 1 | 10 | 7.4 |
| 2 | 25 | 8.0 |
| 3 | 60 | 7.1 |
| 4 | 120 | 6.4 |

Figure 4C:
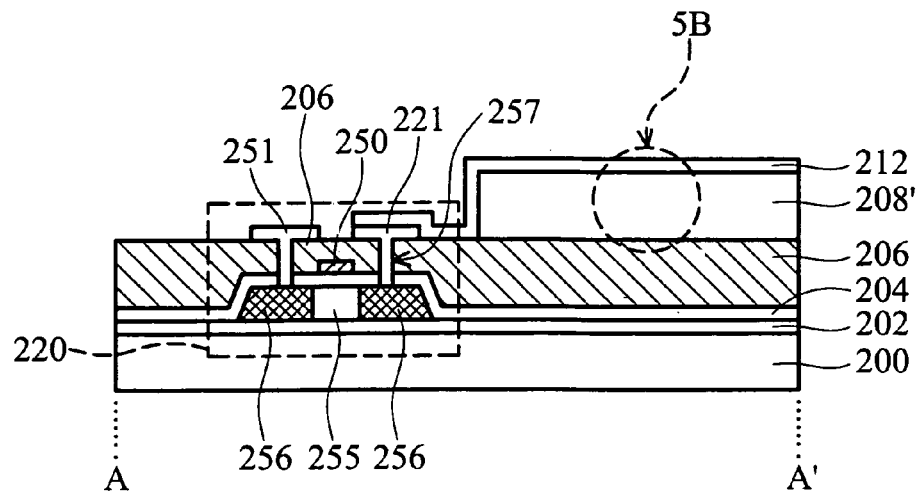
Figure 4D:
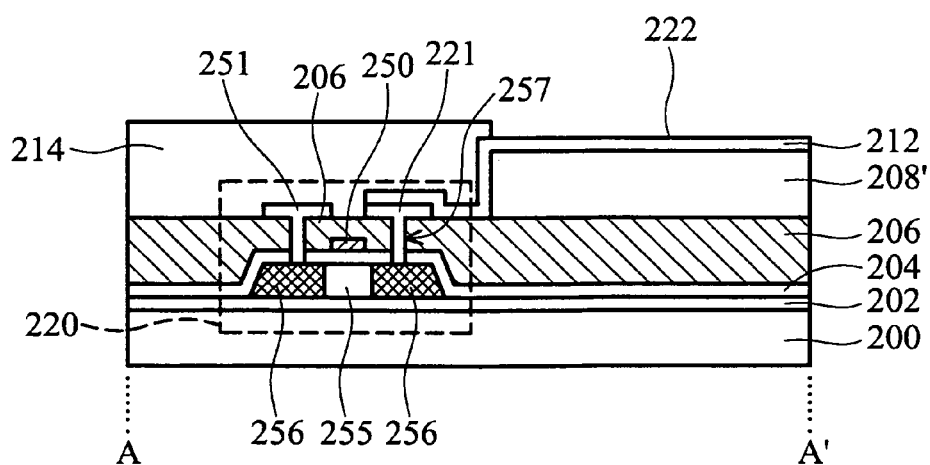
Figure 4E:
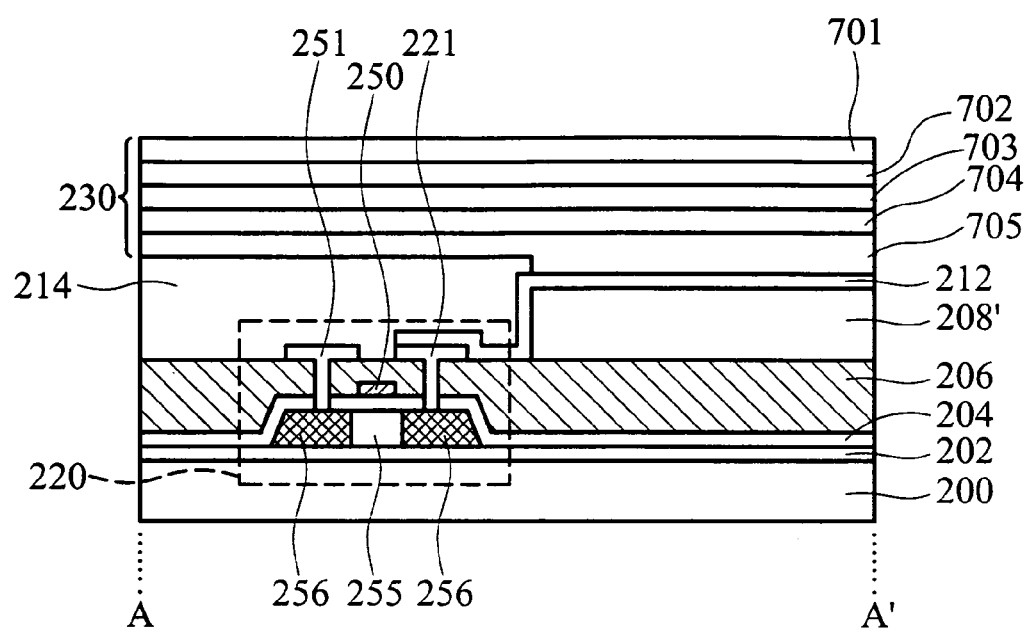
Figure 5B:
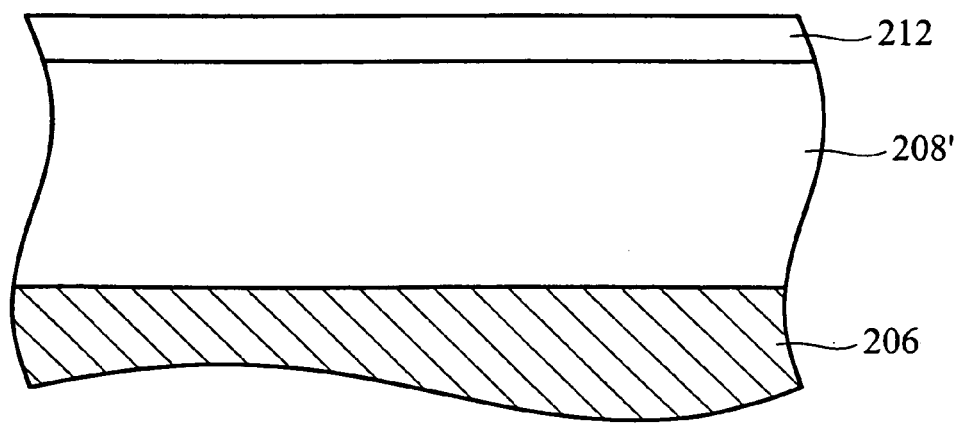
FIG. 5B is a close-up cross-section view of location 5B shown in FIG. 4C after planarization.

FIGS. 4C-4E are cross-section views to illustrate the subsequent fabrication of the OLED device. In FIG. 4C, a transparent electrode 212 is formed on the planarized color filter 208'. A transparent conductive layer 212 is first conformally formed on the drain electrode 221 of the LTPS-TFT 220, and then the electrode 212 is defined by lithography and etching (e.g., by dry or wet etching) to remove a part of the transparent conductive layer 212. The transparent conductive layer 212 may be a layer of indium tin oxide (ITO), indium zinc oxide (IZO), aluminum zinc oxide (AZO) or zinc oxide (ZnO), formed by sputtering, electron-beam evaporation deposition, thermal evaporation deposition, chemical vapor deposition or spray pyrolysis. The surface of the transparent conductive layer 212 may be further planarized by, for example, chemical mechanical polishing. This planar surface of the transparent conductive layer 212 helps to ameliorate short circuit and current leakage.

In FIG. 4D, an insulating layer 214 is formed on the transparent conductive electrode 212. The insulating layer 214 is then etched, using the transparent electrode 212 as an etch-stop, to define a predetermined area 222 for an organic light-emitting layer on the transparent conductive electrode 212.

In FIG. 4E, an organic light-emitting layer 230 is formed on the predetermined area 222 and the insulating layer 214, allowing contact between the organic light-emitting layer 230 and the transparent conductive electrode 212. The organic light-emitting layer 230 may be of small-molecule or polymeric organic light-emitting materials.

In the embodiment, the organic light-emitting layer 230 can be made from white-light-emitting materials including an electron-injecting layer 701, an electron transport layer 702, an emitting layer 703, a hole transport layer 704 and a hole-injecting layer 705.

Finally, referring to FIG. 3, an electrode 240 is formed on the organic light-emitting layer 230, with contact therebetween to serve as a cathode of a OLED 150, and a substrate 200' is disposed on the cathode electrode 240, facing the substrate 200. The electrode 240 may be formed by vacuum thermal evaporation deposition or sputtering. To serve as the cathode of an organic light-emitting diode 105, materials with a low-work function are preferable, such as Ca, Al, Mg, MgAg, AlLi, in which Mg, Mg—Ag alloy, or a stack of Mg/MgAg and ITO are more preferable.

The organic light-emitting device of the embodiment comprises, as shown in FIG. 3, the planarized color filter 208' on the active matrix substrate 200, the anode electrode 212 on the planarized color filter 208', the organic light-emitting layer 230 on the anode electrode 212, the cathode electrode 240 on the organic light-emitting layer 230, and the substrate 200' on the cathode electrode 240, facing the active matrix substrate 200, wherein the surface roughness of the planarized color filter 208' and the anode electrode 212 are less than 10 nm. The organic light-emitting layer 230 comprises the electron-injecting layer 701, electron transport layer 702, emitting layer 703, hole transport layer 704 and the hole-injecting layer 705.

Accordingly, by planarizing the color filter 208, surface roughness is reduced, and a planar surface of the anode electrode 212 is ensured.

Furthermore, without requiring a planarization layer between the color filter 208 and the anode electrode 212, the surface roughness of the color filter 208 and the anode electrode 212 are reduced, simplifying fabrication and improving performance.

Figure 6:
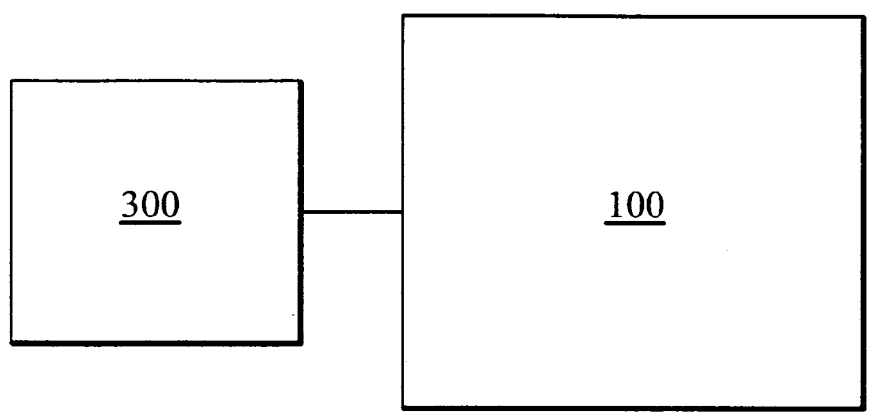
FIG. 6 is a schematic drawing of an electronic device incorporating the organic light emitting device shown in FIG. 2.

FIG. 6 is a schematic drawing of an electronic device incorporating the organic light emitting device shown in FIG. 2. The electronic device 400 includes a controller 300 operatively coupled to the organic light emitting device 100 for controlling operation of organic light emitting device 100. The electronic device can be, for example, a mobile telephone, a personal computer, or a personal digital assistant (PDA).

The foregoing description has been presented for purposes of illustration and description. Obvious modifications or variations are possible in light of the above teaching. The embodiments were chosen and described to provide the preferred illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An organic light-emitting device, comprising:
   a substrate;
   a color filter disposed on the substrate, wherein the color filter has a surface roughness (Ra) less than 10 nm;
   a first electrode contacting the color filter, wherein the first electrode has a surface roughness (Ra) less than 10 nm;
   an organic light-emitting layer disposed on the first electrode; and
   a second electrode disposed on the organic light-emitting layer.

2. The organic light-emitting device as claimed in claim 1, wherein the electrode, the organic light-emitting layer and the second electrode comprise a monochromatic organic light-emitting device.

3. The organic light-emitting device as claimed in claim 2, wherein the monochromatic organic light-emitting device is a white-light organic light-emitting device.

4. The organic light-emitting device as claimed in claim 1, wherein the first electrode comprises an indium tin oxide (ITO) electrode, indium zinc oxide (IZO) electrode or a metal oxide.

5. The organic light-emitting device as claimed in claim 1, wherein the color filter is formed by an excimer UV treatment, a corona treatment, O2 plasma treatment, or polishing.

6. An electronic device including the organic light emitting device of claim 1.

7. A light-emitting device, comprising:
   a substrate;
   a color filter on the substrate, the color filter having a planarized surface; and
   a first electrode contacting the planarized surface of the color filter.

8. The light emitting device of claim 7, wherein the planarized surface of the color filter has a surface roughness (Ra) less than 10 nm.

9. The light emitting device of claim 7, wherein the planarized surface of the color filter is planarized by UV treatment, O2 plasma treatment, or polishing.

10. The light emitting layer of claim 9, wherein the O2 plasma treatment includes exposing the color filter to Ar, O2 or H2O before the first electrode is f formed on the color filter.

11. The light emitting device of claim 7, wherein the first electrode comprises a planarized surface.

12. The light emitting device of claim 11, wherein the planarized surface of the first electrode is planarized by UV treatment, O2 plasma treatment, or polishing.

13. The light emitting device of claim 7, further comprising:
   an organic light-emitting layer on the first electrode; and
   a second electrode on the organic light-emitting layer.

14. The light emitting device of claim 13, wherein the first electrode, the organic light-emitting layer and the second electrode comprise a monochromatic organic light-emitting diode.

15. The light emitting device of claim 13, wherein the organic light-emitting layer is a stacked layer comprising an electron-injecting layer, an electron-transport layer, a light-emitting layer, a hole-transport layer, and a hole-injecting layer.

16. The light emitting layer of claim 13, wherein the second electrode comprises a conductive material including one of Ca, Al, Mg, MgAg, AlLi or a combination thereof.

17. The light emitting layer of claim 13, further comprising active elements on the substrate, wherein the active elements comprise at least one of an amorphous-Si thin-film transistor and a poly-Si thin-film transistor.

18. The light emitting layer of claim 7, wherein the first electrode comprises a transparent conductive material including indium tin oxide (ITO) or indium zinc oxide (IZO).

19. The light emitting device of claim 7, wherein the light emitting device is an organic light emitting device.

20. An electronic device including the light emitting device of claim 7.

* * * * *